(12) United States Patent
Kajii

(10) Patent No.: US 8,220,691 B2
(45) Date of Patent: Jul. 17, 2012

(54) BONDING APPARATUS

(75) Inventor: Yoshihisa Kajii, Kanazawa (JP)

(73) Assignee: Shibuya Kogyo Co., Ltd., Kanazawa-shi, Ishikawa-ken (JP)

( * ) Notice: Subject to any disclaimer, the term of this patent is extended or adjusted under 35 U.S.C. 154(b) by 0 days.

(21) Appl. No.: 12/946,956

(22) Filed: Nov. 16, 2010

(65) Prior Publication Data

US 2011/0121055 A1 May 26, 2011

(30) Foreign Application Priority Data

Nov. 20, 2009 (JP) ................................. 2009-264855

(51) Int. Cl.
*H05K 3/00* (2006.01)
*B23K 20/14* (2006.01)
*B23K 101/40* (2006.01)

(52) U.S. Cl. ........ 228/42; 228/44.7; 228/49.5; 156/285; 156/381; 29/729; 29/740

(58) Field of Classification Search .................... 228/42, 228/44.7, 49.5; 156/285, 381; 29/729, 740
See application file for complete search history.

(56) References Cited

U.S. PATENT DOCUMENTS 6,102,273 A * 8/2000 Satoh ............................... 228/42
7,182,793 B2 * 2/2007 Duan et al. ................... 29/25.01

FOREIGN PATENT DOCUMENTS

JP        06302944 A  * 10/1994
JP        3455838       8/2003

* cited by examiner

*Primary Examiner* — Jessica L Ward
*Assistant Examiner* — Devang R Patel
(74) *Attorney, Agent, or Firm* — Drinker Biddle & Reath LLP

(57) ABSTRACT

There is provided a bonding apparatus for holding a semiconductor chip by using a bonding head and bonding the semiconductor chip onto a substrate. The bonding head includes: a holding part for holding the semiconductor chip; gas exhausting means for surrounding the holding part and exhausting gas toward the holding part; and an elevator means for lifting down/up the gas exhausting means to a lift-down state, in which at least a portion of the gas exhausting means protrudes downward from the bottom face of the holding part, and a lift-up state, in which any portion of the gas exhausting means does not protrude downward from the bottom face of the holding part. When the bonding apparatus holds and conveys the semiconductor chip by using the bonding head, the bonding apparatus brings the gas exhausting means to the lift-down state and exhausts the gas toward the semiconductor chip.

2 Claims, 6 Drawing Sheets

BONDING APPARATUS

CROSS-REFERENCE TO RELATED APPLICATION

This application claims priority from Japanese Patent Application No. 2009-264855 filed on Nov. 20, 2009, the entire subject matter of which is incorporated herein by reference.

BACKGROUND OF THE INVENTION

1. Field of the Invention

The invention relates to an improvement of a bonding apparatus, and, in particular, to a bonding apparatus including a bonding head having means for anti-oxidation of a semiconductor chip.

2. Description of the Related Art

Conventionally, with a bonding apparatus for thermally bonding a semiconductor chip onto a substrate, it is known that bonding defects may occur due to oxidation of a portion to be bonded in the semiconductor chip. In order to prevent the bonding defects, there has been employed shielding means for shielding the portion to be bonded with inert gas (including nitrogen gas, etc).

In such a bonding apparatus with the shielding means, in order to suppress the oxidation of the portion to be bonded in the semiconductor chip when thermally bonding the semiconductor chip onto the substrate, as shown in FIG. 5 of Japanese Patent No. 3455838, which shows a background art thereof, a hood is provided to a substrate supporting stage and the nitrogen gas is blown. However, in order to decrease oxygen concentration by blowing the nitrogen gas throughout the substrate supporting stage, considerable amount of the nitrogen gas may be required. Accordingly, in reality, it is difficult to reduce the oxygen concentration to the extent necessary to suppress the oxidation of the portion to be bonded in the semiconductor chip.

Therefore, as shown in FIG. 1 to FIG. 4 of Japanese Patent No. 3455838, a plurality of holes for supplying the inert gas are provided to the bottom face of the bonding head, and there is provided shielding means shielding the portion to be bonded in the semiconductor chip from the oxygen by supplying the inert gas through the supplying holes. In this shielding means, since the substrate and substrate supporting stage exist just under the shielding means during the bonding operation, this shielding means is effective during the bonding operation. However, in this shielding means, it is not possible to shield with the inert gas the portion to be bonded in the semiconductor chip during conveying the semiconductor chip using the bonding head and being ready to hold the semiconductor chip during such a conveying operation and being ready to hold the semiconductor chip. Accordingly, when conveying the semiconductor chip and being ready to hold the semiconductor chip, the oxidation of the portion to be bonded in the semiconductor chip may still occur.

SUMMARY OF THE INVENTION

An object of the invention is to provide a bonding apparatus which securely shields with inert gas a portion to be bonded in a semiconductor chip not only during bonding the semiconductor chip onto a substrate on a substrate supporting stage but also during holding and conveying the semiconductor chip using a bonding head and being ready to hold the semiconductor chip, thereby suppressing oxidation of the portion to be bonded in the semiconductor chip, and which, after the bonding operation, rapidly cools off the bonded portion and bonding head.

According to a first aspect of the invention, there is provided a bonding apparatus comprising: a bonding head configured to hold and convey a semiconductor chip; and a stage configured to support a substrate, wherein the bonding apparatus holds the semiconductor chip using the bonding head and bonds the semiconductor chip onto the substrate, wherein the bonding head comprises: a holding part configured to hold the semiconductor chip at a bottom face thereof; gas exhausting means configured to surround the holding part and exhaust gas toward the holding part; and elevator means configured to lift down/up the gas exhausting means relative to the holding part, wherein the elevator means lifts down/up the gas exhausting means to bring the gas exhausting means to a lift-down state and a lift-up state, wherein in the lift-down state, at least a portion of the gas exhausting means protrudes downward from the bottom face of the holding part, and wherein in the lift-up state, any portion of the gas exhausting means does not protrude downward from the bottom face of the holding part, and wherein when the bonding apparatus holds and conveys the semiconductor chip by using the bonding head, the bonding apparatus brings the gas exhausting means to the lift-down state and exhausts the gas toward the semiconductor chip held by the holding part.

According to a second aspect of the invention, in the bonding apparatus, wherein the gas exhausting means has a ring shape so as to surround the holding part, wherein the bonding apparatus further comprises a closing member above the gas exhausting means, wherein the closing member is fixed to the holding part so as to close a gap between the holding part and the gas exhausting means, and wherein the closing member closes the gap holding part and the gas exhausting means when the gas exhausting means is brought to the lift-up state.

According to a third aspect of the invention, in the bonding apparatus, wherein the stage has a shape so as to be surrounded with the gas exhausting means, and wherein the bonding apparatus brings the gas exhausting means to the lift-down state and exhausts the gas toward the semiconductor chip during the bonding or after the bonding.

According to the first aspect of the invention, the bonding apparatus, when holding and conveying the semiconductor chip using the bonding head, brings the gas exhausting means to the lift-down state and exhausts the inert gas toward the semiconductor chip held by the holding part. In this way, the inert gas is directly supplied toward the semiconductor chip just after the semiconductor chip is delivered from the chip supplying stage to the bonding head. Accordingly, during holding and conveying the semiconductor chip using the bonding head and being ready to hold the semiconductor chip, the oxidation of the portion to be bonded in the semiconductor chip may be suppressed. Moreover, because the inert gas is directly exhausted toward the semiconductor chip, consumption of the inert gas may be saved.

According to the second aspect of the invention, by configuring the gas exhausting means to have a ring shape so as to surround the holding part, the radial exhaustion of the inert gas toward the holding part may be realized. Moreover, by providing the closing member above the gas exhausting means and is fixed to the holding part so as to close a gap between the holding part and the gas exhausting means, the closing member may close the gap holding part and the gas exhausting means when the gas exhausting means is brought to the lift-up state. In this way, the flow of the inert gas may be controlled so as to be directed to the holding part, thereby securely shielding with the inert gas the portion to be bonded in the semiconductor chip, and thus the oxidation of the portion to be bonded in the semiconductor chip may be more effectively suppressed. Furthermore, since the inert gas may be locally exhausted, consumption of the inert gas may be saved.

According to the third aspect of the invention, by configuring the stage supporting the substrate to have a shape so as to be surrounded with the gas exhausting means, and the bonding apparatus brings the gas exhausting means to the lift-down state and exhausts the gas toward the semiconductor chip during the bonding or after the bonding. In this manner, the apparatus securely shields with the inert gas the portion to be bonded in the semiconductor chip and thus more effectively suppresses the oxidation of the portion to be bonded in the semiconductor chip. At the same time, the consumption of the inert gas may be saved. Furthermore, after the bonding, the exhausted gas is switched from the inert gas to cooling air so as to externally cool off the bonded portion and the bonding head rapidly.

DETAILED DESCRIPTION OF THE EXEMPLARY EMBODIMENTS

Figure 2:
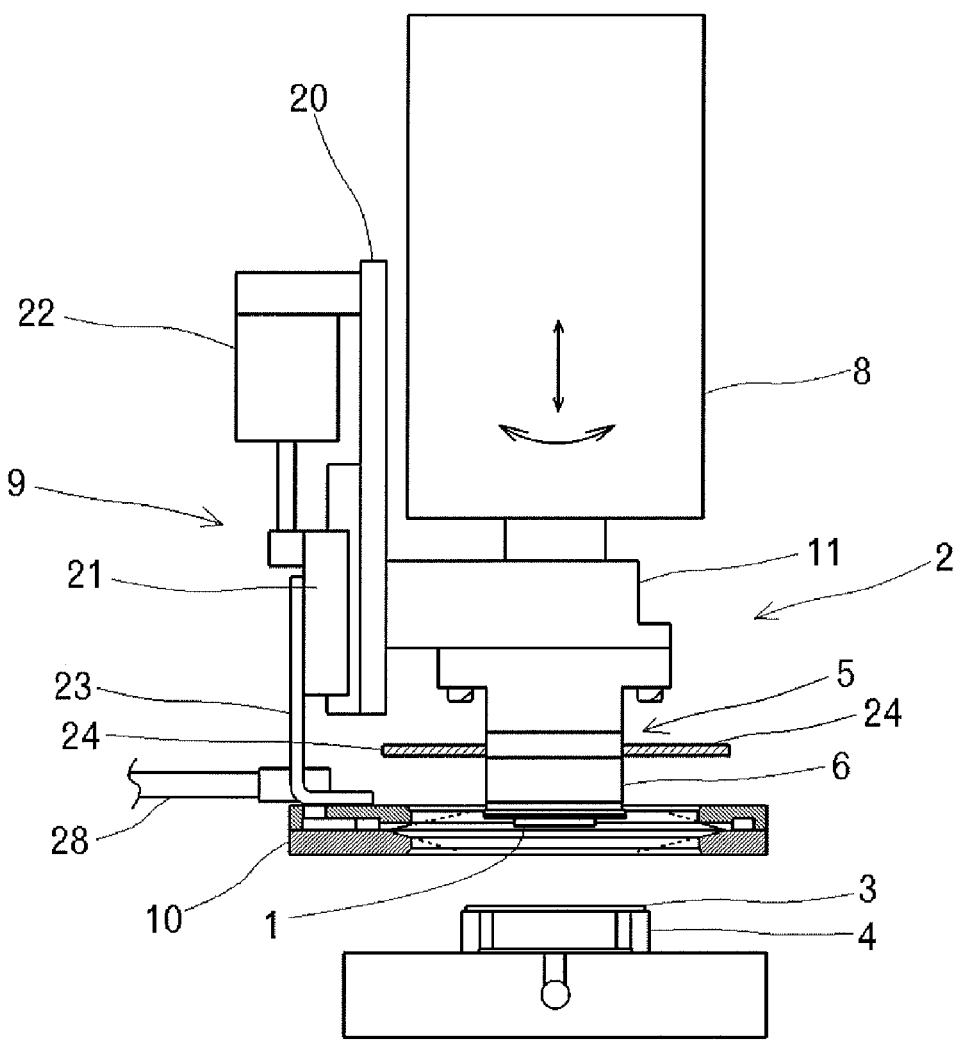
FIG. 2 is a partial cross-sectional view illustrating a position of the gas exhausting ring when the semiconductor chip is conveyed using the bonding head.
Figure 3:
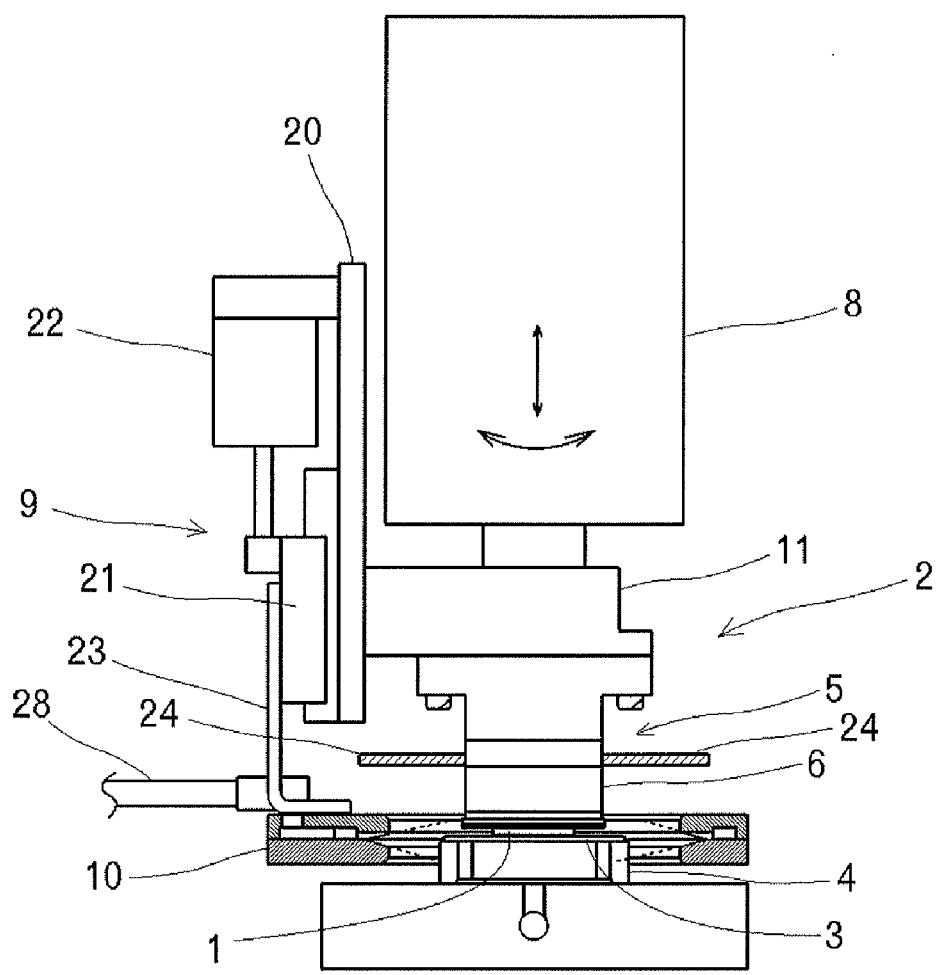
FIG. 3 is a partial cross-sectional view illustrating a position of the gas exhausting ring when the semiconductor chip is bonded onto the substrate.

Hereinafter, an exemplary embodiment of the invention will be described with reference to the drawings. As show in FIGS. 1 to 3, reference numeral 1 refers to a semiconductor chip, and reference numeral 3 refers to a substrate. A bonding apparatus as shown in FIG. 2 and FIG. 3 includes a bonding head 2 holding and conveying the semiconductor chip 1 and a substrate supporting stage 4 supporting substrate 3. The bonding apparatus holds the semiconductor chip 1 with the bonding head 2 and then bonds the semiconductor chip 1 onto the substrate 3. Incidentally, in this exemplary embodiment, the substrate supporting stage 4 is accommodated in an inner space of a gas exhausting ring 10 (which will be described later) and has a shape and size so as to be surrounded with gas exhausting ring 10.

The bonding head 2 includes a chip holding part 5 for sucking and holding the semiconductor chip 1 at a bottom face thereof and a heating part 6 for performing thermal compression. The bonding head 2 includes an X axis driving unit (not shown) responsible for horizontal movement of the bonding head 2 and a Z axis and θ axis driving unit 8 responsible for ascent and descent of the bonding head 2 and rotation of the bonding head 2. The X axis driving unit and the Z axis and θ axis driving unit 8 function as a conveying unit for sucking and holding the semiconductor chip 1 from a chip supplying state 7 (shown only in FIG. 1), conveying the semiconductor chip 1, and bonding the semiconductor chip 1 onto the substrate 3 supported with the substrate supporting stage 4. Incidentally, in this exemplary embodiment, a size of the chip supplying stage 7 becomes larger than a size of an inner space of a gas exhausting ring 10 (which will be described later).

The gas exhausting ring 10 (one example of gas exhausting means) is mounted through a ring elevator unit 9 (one example of elevator means) onto the bonding head 2. Incidentally, reference numeral 11 in FIG. 1 to FIG. 3 refers to an attaching part for mounting the ring elevator unit 9 and the gas exhausting ring 10 onto the bonding head 2.

Figure 4:
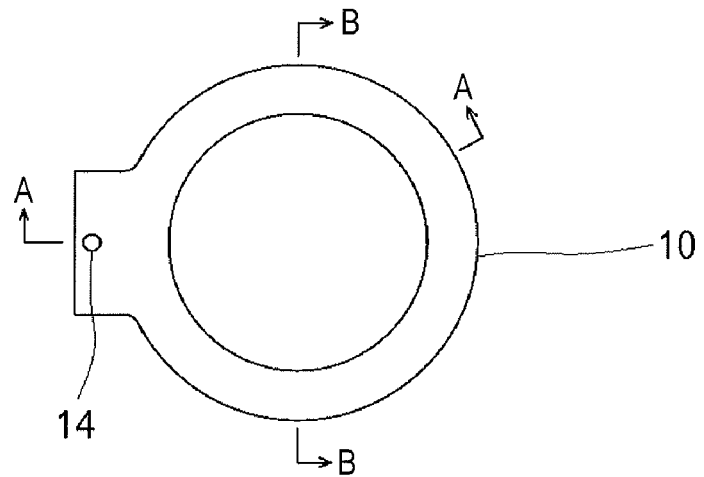
FIG. 4 is a plan view of the gas exhausting ring.
Figure 5:
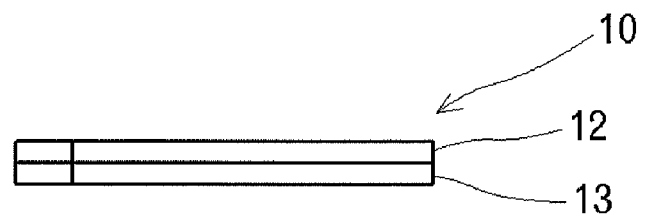
FIG. 5 is a side view of the gas exhausting ring.

The gas exhausting ring 10, as shown in FIG. 4, has a ring shape in such a way to the surround chip holding part 5 of the bonding head 2. Incidentally, reference numeral 14 in FIG. 4 refers to a gas introducing hole. As shown in FIG. 5, the gas exhausting ring 10 includes an upper ring member 12 and a lower ring member 13.

Figure 6:
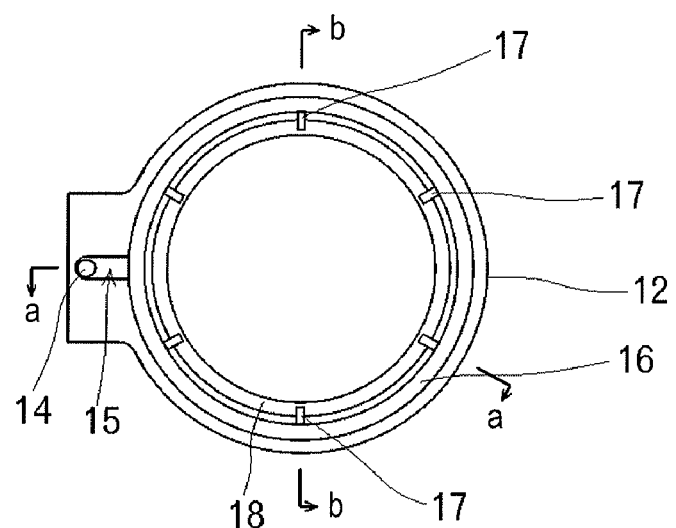
FIG. 6 is a bottom view of an upper member of the gas exhausting ring.
Figure 9:
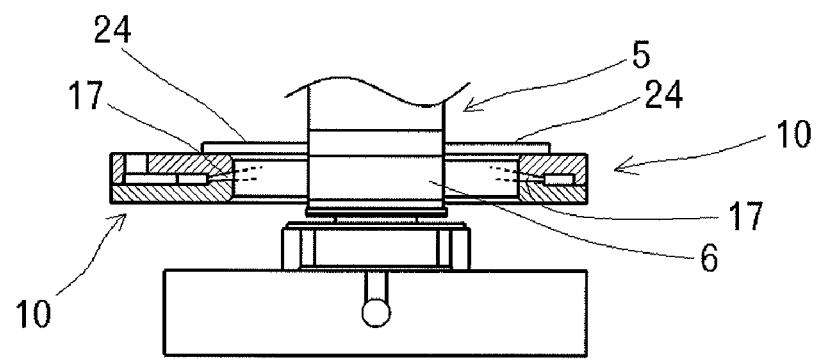
FIG. 9 is a partial cross-sectional view illustrating one example in which the gas exhausting hole of the gas exhausting ring has an angled shape so as to exhaust the gas upwardly.

FIG. 6 is a bottom view of the upper ring member 12. Grooves for forming a gas introducing channel 15, an annular gas channel 16 and a gas exhausting hole 17 are formed on the upper ring member 12. The gas exhausting ring 10 is formed by making the upper ring member 12 be in a tight contact with the lower ring member 13. The gas introducing channel 15 for introducing the gas from the gas introducing hole 14, the annular gas channel 16 and the gas exhausting hole 17 communicate with the gas introducing hole 14. In this exemplary embodiment, gas exhausting hole 17 is placed at six positions as shown in FIG. 6. Moreover, in this exemplary embodiment, the gas exhausting hole 17 has a shape in such way to exhaust gas in a horizontal direction through tapered surfaces 18, 19 of the upper and lower ring members 12, 13. Alternatively, as shown in FIG. 9, the gas exhausting hole 17 has an angled shape so as to exhaust the gas upwardly.

Figure 7:
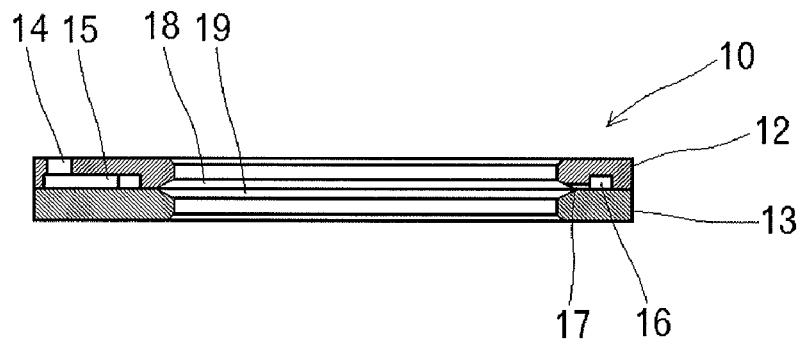
FIG. 7 is a cross-sectional view of the gas exhausting ring taken at a line A-A of FIG. 4.
Figure 8:
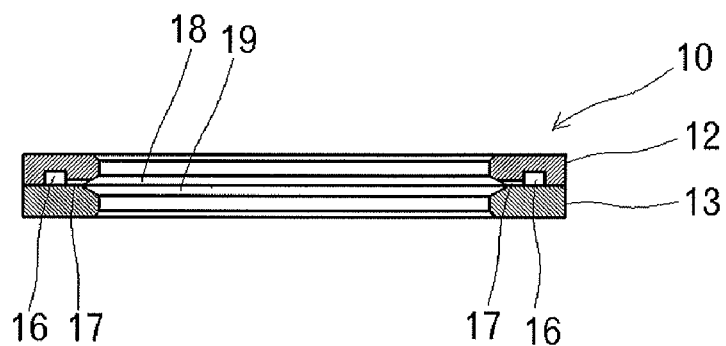
FIG. 8 is a cross-sectional view of the gas exhausting ring taken at a line B-B of FIG. 4.

FIG. 7 is a cross-sectional view of the gas exhausting ring 10 taken at a line A-A of FIG. 4 and at the same time is a cross-sectional view of gas exhausting ring 10 taken at a line a-a of FIG. 6. FIG. 8 is a cross-sectional view of the gas exhausting ring 10 taken at a line B-B of FIG. 4 and at the same time is a cross-sectional view of the gas exhausting ring 10 taken at a line b-b of FIG. 6.

The ring elevator unit 9 responsible for ascent and descent of gas exhausting ring 10 includes: a base 20 attached to the attaching part 11 of the bonding head 2; a slide guide 21 installed into the base 20; a ring elevator cylinder 22 responsible for up and down movements of the slide guide 21; and a connecting member 23 for connecting the slide guide 21 to the gas exhausting ring 10 located under the slide guide 21. With the operations of the ring elevator cylinder 22, the ring elevator unit 9 lifts up and down the gas exhausting ring 10. The ring elevator unit 9 lifts down the gas exhausting ring 10 to bring the gas exhausting ring 10 to a lift-down state in which at least a portion of the gas exhausting ring 10 protrudes downward from a bottom face of the chip holding part 5. The ring elevator unit 9 lifts up the gas exhausting ring 10 to bring the gas exhausting ring 10 to a lift-up state in which any portion of the gas exhausting ring 10 does not protrude downward from the bottom face of the chip holding part 5.

The positions of the gas exhausting ring 10 in FIG. 2 and FIG. 3 correspond to the lift-down state. In this state, the gas (inert gas for anti-oxidation such as nitrogen gas, argon gas, helium gas, etc; or cooling air) from the gas exhausting hole 17 of the gas exhausting ring 10 is exhausted directly toward the semiconductor chip 1. The position of the gas exhausting ring 10 in FIG. 1 corresponds to the lift-up state. In this state, any portion of the gas exhausting ring 10 does not protrude downward from the bottom face of the chip holding part 5 so that the gas exhausting ring 10 does not become obstacle when the chip holding part 5 of the bonding head 2 sucks and holds the semiconductor chip 1. Incidentally, in case the size of the substrate supporting stage 4 is larger than the size of the inner space of the gas exhausting ring 10, the position of the gas exhausting ring 10 is controlled to correspond to the lift-up state even when bonding the semiconductor chip 1 onto the substrate 3.

A closing plate 24 is provided to the chip holding part 5 of the bonding head 2. The closing plate 24 closes a gap between the gas exhausting ring 10 and the chip holding part 5 of the bonding head 2 when the position of the gas exhausting ring 10 corresponds to the lift-up state. With the closing plate 24, the flow direction of the gas (inert gas) exhausting from the gas exhausting ring 10, in the lift-up state, changes downward and thus the gas (inert gas) may be supplied to the semiconductor chip 1 while preventing the gas from leaking upward.

Figure 1:
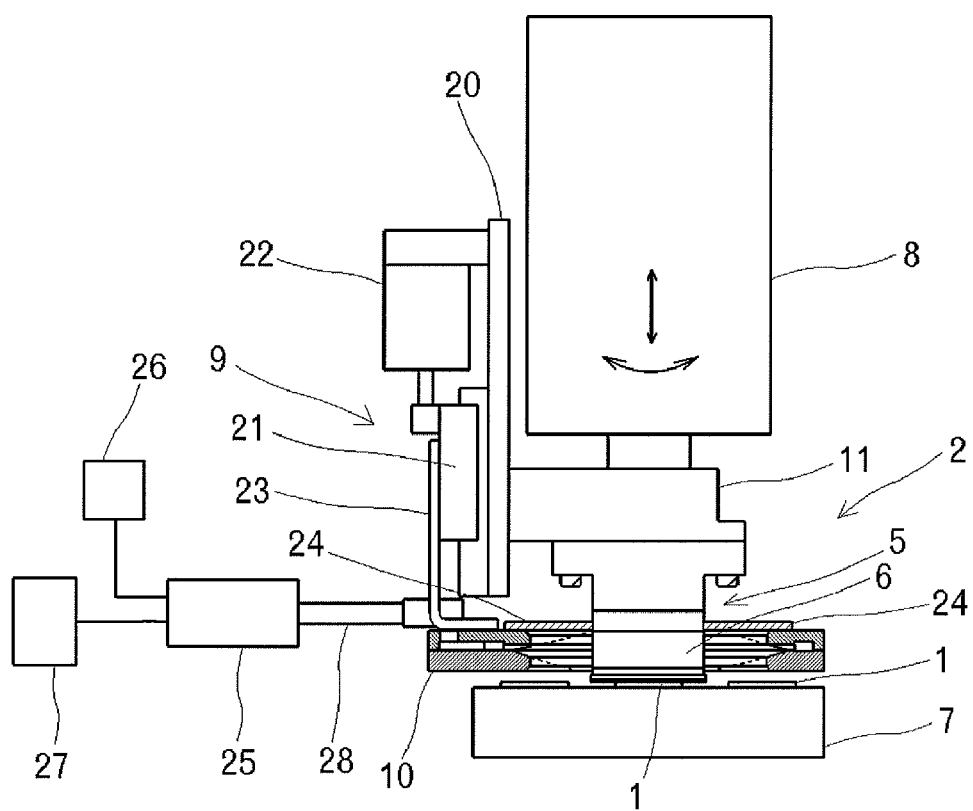
FIG. 1 is a partial cross-sectional view illustrating a position of the gas exhausting ring when the semiconductor chip is delivered from the chip supplying stage to the bonding head.

A flexible gas conduit 28 is connected to the gas introducing hole 14 of gas exhausting ring 10 at one end thereof, as shown in FIG. 1. The gas conduit 28 communicates with an air supply source 26 and an inert gas supply source 27 at another end thereof through a switching device 25.

Hereinafter, operations of the gas exhausting ring 10 according to the exemplary embodiment will be described. FIG. 1 is a partial cross-sectional view illustrating the position of the gas exhausting ring 10 when the semiconductor chip 1 is delivered from the chip supplying stage 7 to the bonding head 2. The bonding head 2 moves, by the X axis driving unit, toward above the semiconductor chip 1 to be sucked and held on the chip supplying stage 7. Then, the bonding head 2 goes down by the Z axis and θ axis driving unit 8 toward the semiconductor chip 1 and holds and sucks the semiconductor chip 1 by using the chip holding part 5.

At this time, it is unable to suck and hold the semiconductor chip 1 by using the chip holding part 5 unless the gas exhausting ring 10 is located at a higher position than the bottom face (chip sucking face) of the chip holding part 5 of the bonding head 2. This is because the size of chip supplying stage 7 is larger than the size of the inner space of the gas exhausting ring 10. For such a reason, with the operation of the ring elevator cylinder 22, the gas exhausting ring 10 goes up to become the lift-up state.

When the semiconductor chip 1 is held in the suction way using the chip holding part 5, the switching device 25 operates so that the inert gas from the inert gas supply source 27 flows through the gas conduit 28 to the gas introducing hole 14 of the gas exhausting ring 10. The inert gas then flows through the gas introducing channel 15 to the annular gas channel 16. A number of gas exhausting holes 17 (six gas exhausting holes in this embodiment) are installed into the annular gas channel 16, and, thus, the inert gas from the gas exhausting holes 17 is exhausted toward the inner space of the gas exhausting ring 10. Incidentally, although nitrogen gas is employed as the inert gas in this exemplary embodiment, the invention is not limited thereto. For example, other inert gases for the anti-oxidation such as argon gas or helium gas may be employed.

At this time, the position of the gas exhausting ring 10 corresponds to the lift-up state, and the inert gas from the gas exhausting holes 17 is not directly exhausted toward the semiconductor chip 1. However, the gap between the gas exhausting ring 10 and the chip holding part 5 of the bonding head 2 are closed by the closing plate 24 at an upper part of the gas exhausting ring 10. Therefore, the flow direction of the gas (inert gas) exhausting from the gas exhausting ring 10 changes downward and thus the gas (inert gas) may be supplied to the semiconductor chip 1, thereby shielding the semiconductor chip 1 from oxygen. Incidentally, when the gas exhausting hole 17 has the angled shape so as to exhaust the inert gas upwardly as shown in FIG. 9, change of the flow direction of the gas by the closing plate 24 is considerably effective.

When the semiconductor chip 1 has been sucked and held by using the chip holding part 5, the bonding head 2 goes up with the Z axis and θ axis driving unit 8 and then moves with the X axis driving unit toward above the substrate 3 supported with the substrate supporting stage 4 and further goes down with the Z axis and θ axis driving unit 8 to a bonding position.

FIG. 2 is a partial cross-sectional view illustrating the position of the gas exhausting ring 10 when the semiconductor chip 1 is conveyed by using the bonding head 2. At this time, even when at least a portion of the gas exhausting ring 10 protrudes downward from the bottom face of the chip holding part 5, the gas exhausting ring 10 does not become obstacle in the conveying process. Therefore, the position of the gas exhausting ring 10 is controlled with the ring elevator cylinder 22 to correspond to the lift-down state. In this state, the inert gas from the gas exhausting holes 17 is directly exhausted toward the semiconductor chip 1, thereby shielding the semiconductor chip 1 from oxygen.

When the bonding head 2 goes down with the Z axis and θ axis driving unit 8 and the semiconductor chip 1 sucked and held by using the chip holding part 5 contacts the substrate 3, bonding operation begins to be performed using the thermal compression. At this bonding operation, the gas exhausting ring 10 does not become obstacle even though the position of the gas exhausting ring 10 corresponds to the lift-down state. This is because the size of the substrate supporting stage 4 is smaller than the size of the inner space of the gas exhausting ring 10. For such a reason, the inert gas from the gas exhausting holes 17 is directly exhausted toward the semiconductor chip 1 as shown in FIG. 3 during the bonding operation as the position of the gas exhausting ring 10 corresponds to the lift-down state. FIG. 3 is a partial cross-sectional view illustrating the position of the gas exhausting ring 10 when the semiconductor chip 1 is bonded onto the substrate 3.

When completing the bonding operation, the switching device 25 operates while the position of gas exhausting ring 10 corresponds to the lift-down state, so that cooling air from the cooling air supply source 26 flows through the gas conduit 28 to the gas introducing hole 14 of the gas exhausting ring 10. The cooling air then flows through the gas introducing channel 15 to the annular gas channel 16. Next, the cooling air from the gas exhausting holes 17 is exhausted toward the semiconductor chip 1 to cool off the semiconductor chip 1. Incidentally, although the air is employed as the cooling gas in this exemplary embodiment, the invention is not limited thereto. For example, the inert gas for the anti-oxidation may be used to cool off the semiconductor chip 1.

What is claimed is:

1. A bonding apparatus comprising:
   a bonding head configured to hold and convey a semiconductor chip; and
   a stage configured to support a substrate, wherein the bonding apparatus holds the semiconductor chip using the bonding head and bonds the semiconductor chip onto the substrate,
wherein the bonding head comprises:
   a holding part configured to hold the semiconductor chip at a bottom face thereof;
gas exhausting member configured to surround the holding part and exhaust gas toward the holding part; and
elevator unit configured to lift down/up the gas exhausting member relative to the holding part,
wherein the elevator unit lifts down/up the gas exhausting member to bring the gas exhausting member to a lift-down state and a lift-up state,
wherein in the lift-down state, at least a portion of the gas exhausting member protrudes downward from the bottom face of the holding part,
wherein in the lift-up state, any portion of the gas exhausting member does not protrude downward from the bottom face of the holding part, wherein when the bonding apparatus holds and conveys the semiconductor chip by using the bonding head, the bonding apparatus brings the gas exhausting member to the lift-down state and exhausts the gas toward the semiconductor chip held by the holding part,
wherein the gas exhausting member has a ring shape so as to surround the holding part, wherein the bonding apparatus further comprises a closing member above the gas exhausting member, wherein the closing member is fixed to the holding part so as to close a gap between the holding part and the gas exhausting member, and
wherein the closing member closes the gap between the holding part and the gas exhausting member when the gas exhausting member is brought to the lift-up state.

2. The bonding apparatus according to claim 1,
wherein the stage has a shape so as to be surrounded with the gas exhausting member, and
wherein the bonding apparatus brings the gas exhausting member to the lift-down state and exhausts the gas toward the semiconductor chip during the bonding or after the bonding.

* * * * *